(12) United States Patent
Satpathy et al.

(10) Patent No.: US 9,276,583 B1
(45) Date of Patent: Mar. 1, 2016

(54) SOFT DARK BIT MASKING WITH INTEGRATED LOAD MODULATION AND BURN-IN INDUCED DESTABILIZATION FOR PHYSICALLY UNCLONABLE FUNCTION KEYS

(71) Applicant: Intel Corporation, Santa Clara, CA (US)

(72) Inventors: Sudhir K Satpathy, Hillsboro, OR (US); Sanu K Mathew, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/748,591

(22) Filed: Jun. 24, 2015

(51) Int. Cl.
*H03K 19/00* (2006.01)
*H03K 19/177* (2006.01)
*G06F 11/07* (2006.01)

(52) U.S. Cl.
CPC ...... *H03K 19/17768* (2013.01); *G06F 11/0745* (2013.01)

(58) Field of Classification Search
CPC .. G06F 11/07; G06F 11/0745; G06F 11/0793
USPC .................................. 326/8–10, 38
See application file for complete search history.

(56) References Cited

U.S. PATENT DOCUMENTS

| 2015/0046718 A1* | 2/2015 | Meyer .................. H04L 9/0866 713/189 |
| 2015/0178143 A1* | 6/2015 | Mathew et al. ..... G06F 11/0745 714/5.1 |
| 2015/0188717 A1* | 7/2015 | Wu et al. .................. G09C 1/00 380/44 |

* cited by examiner

*Primary Examiner* — Don Le
(74) *Attorney, Agent, or Firm* — Thomas R. Lane

(57) ABSTRACT

Embodiments of an invention for soft dark bit masking are disclosed. In one embodiment, an apparatus includes a basic physically unclonable function (PUF) cell, a load, and a masking circuit. The load is selectively connectable to the basic PUF cell to determine whether the basic PUF cell is unstable. The masking circuit is to mask the output of the basic PUF cell if the basic PUF cell is determined to be unstable. Embodiments of the invention also include mechanisms to reinforce the stability of stable cells, while further destabilizing unstable cells.

20 Claims, 7 Drawing Sheets

METHOD 400

Mask Circuit 500

Stabilization/Destabilization Circuit 600

METHOD 700

SOFT DARK BIT MASKING WITH INTEGRATED LOAD MODULATION AND BURN-IN INDUCED DESTABILIZATION FOR PHYSICALLY UNCLONABLE FUNCTION KEYS

BACKGROUND

1. Field

The present disclosure pertains to the field of information processing, and more particularly, to the field of security in information processing systems.

2. Description of Related Art

Unique, secret keys are used by information processing systems to encrypt confidential information, provide proof of identity, and many other purposes. These keys may be derived from physically unclonable functions that generate random values based on the variability inherent in integrated circuit fabrication.

BRIEF DESCRIPTION OF THE FIGURES

The present invention is illustrated by way of example and not limitation in the accompanying figures.

DETAILED DESCRIPTION

Figure 1:
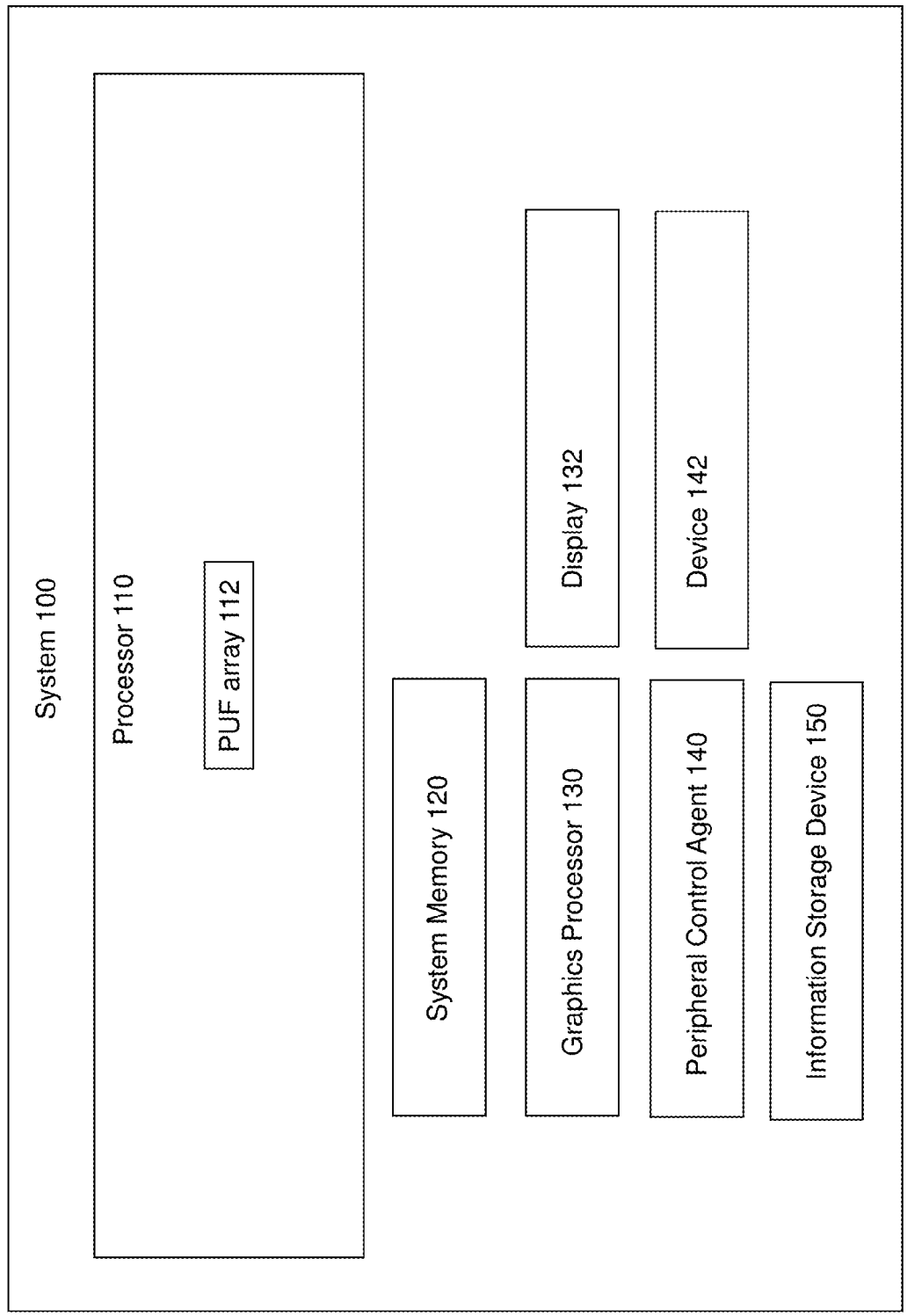
FIG. 1 illustrates a system including a physically unclonable function array according to an embodiment of the present invention.

Embodiments of an invention for physically unclonable function (PUF) key soft dark bit masking are described. In this description, numerous specific details, such as component and system configurations, may be set forth in order to provide a more thorough understanding of the present invention. It will be appreciated, however, by one skilled in the art, that the invention may be practiced without such specific details. Additionally, some well-known structures, circuits, and other features have not been shown in detail, to avoid unnecessarily obscuring the present invention.

In the following description, references to "one embodiment," "an embodiment," "example embodiment," "various embodiments," etc., indicate that the embodiment(s) of the invention so described may include particular features, structures, or characteristics, but more than one embodiment may and not every embodiment necessarily does include the particular features, structures, or characteristics. Further, some embodiments may have some, all, or none of the features described for other embodiments.

As used in this description and the claims and unless otherwise specified, the use of the ordinal adjectives "first," "second," "third," etc. to describe an element merely indicate that a particular instance of an element or different instances of like elements are being referred to, and is not intended to imply that the elements so described must be in a particular sequence, either temporally, spatially, in ranking, or in any other manner.

Also, the terms "bit," "flag," "field," "entry," "indicator," etc., may be used to describe any type or of or content of a storage location in a register, table, database, or other data structure, whether implemented in hardware or software, but are not meant to limit embodiments of the invention to any particular type of storage location or number of bits or other elements within any particular storage location. The term "clear" may be used to indicate storing or otherwise causing the logical value of zero to be stored in a storage location, and the term "set" may be used to indicate storing or otherwise causing the logical value of one, all ones, or some other specified value to be stored in a storage location; however, these terms are not meant to limit embodiments of the present invention to any particular logical convention, as any logical convention may be used within embodiments of the present invention. Furthermore, without limiting embodiments of the present invention to any particular logical or electrical convention, the term "low" may be used to refer to a first logical value (e.g., zero) and/or voltage level, and the term "high" may be used to refer to a second logical value (e.g., one) and/or voltage level.

Also, as used in descriptions of embodiments of the present invention, a "/" character between terms may mean that an embodiment may include or be implemented using, with, and/or according to the first term and/or the second term (and/or any other additional terms).

As described in the background section, unique, keys used for cryptography and other purposes in information processing systems may be derived from PUFs that generate random values based on the variability inherent in integrated circuit (IC) fabrication. For example, slight differences in dopant concentrations, line widths, layer thicknesses, and other process parameters may be acceptable to produce fully functional circuitry, but may manifest themselves as differences in timing behavior among instances of the same circuit on different ICs. PUF cells are small circuits designed to take advantage of the random nature of processing variability to generate an unpredictable but repeatable value (e.g. logical one or logical zero) when challenged and/or evaluated during operation of the IC. An array of PUF cells may be used to generate a random, repeatable, virtually undiscoverable value (a PUF key) that may be used directly as or used to derive a cryptographic key, a secure identification code, or other such value.

However, some PUF cells may have insufficient net processing variation to resolve to the same value every time they are evaluated. Therefore, an IC may include circuitry for post-processing of the raw output of a PUF array for use as a PUF key (e.g., error correction, entropy extraction). Also, arrays of PUF cells may be tested for stability so that only the stable cells are used for generating the PUF key. Unstable cells may be labeled as "dark bits" so that the values generated by these cells may be ignored or replaced.

Testing to identify dark bits may be performed by the manufacturer or vendor of the IC before sale or release to a system manufacturer, system user, or other customer. Typically, the testing is performed under a variety of conditions involving ranges of operating voltage, temperature, and possibly other parameters. PUF cells that do not generate a repeatable value under all conditions may be labeled as dark bits, and their location in the PUF array may be stored in a non-volatile memory to be used as a mask during normal operation. However, a non-volatile dark bit mask is costly in terms of die area and might be used by an attacker to tamper with the PUF key. Therefore, soft dark bit masking according to embodiments of the present invention, or otherwise, may be desired as an alternative to hard dark bit masking.

In soft dark bit masking, testing is performed during normal operation of the IC, for example, by firmware at each start-up of the system, to generate a volatile dark bit mask. Soft dark bit masking according to an embodiment of the present invention may be desired over previously known soft dark bit masking techniques because it may provide greater accuracy, in fewer clock cycles and with less post-processing.

FIG. 1 illustrates system 100, an information processing system including an embodiment of the present invention for PUF key soft dark bit masking. System 100 may represent any type of information processing system, such as a server, a desktop computer, a portable computer, a set-top box, a handheld device such as a tablet or a smart phone, or an embedded control system. System 100 includes processor 110, system memory 120, graphics processor 130, peripheral control agent 140, and information storage device 150. Systems embodying the present invention may include any number of each of these components and any other components or other elements, such as peripherals and input/output devices. Any or all of the components or other elements in this or any system embodiment may be connected, coupled, or otherwise in communication with each other through any number of buses, point-to-point, or other wired or wireless interfaces or connections, unless specified otherwise. Any components or other portions of system 100, whether shown in FIG. 1 or not shown in FIG. 1, may be integrated or otherwise included on or in a single chip (a system-on-a-chip or SOC), die, substrate, or package.

System memory 120 may be dynamic random access memory or any other type of medium readable by processor 110. Graphics processor 130 may include any processor or other component for processing graphics data for display 132. Peripheral control agent 140 may represent any component, such as a chipset component, including or through which peripheral, input/output (I/O), or other components or devices, such as device 142 (e.g., a touchscreen, keyboard, microphone, speaker, other audio device, camera, video or other media device, network adapter, motion or other sensor, receiver for global positioning or other information, etc.) and/or information storage device 150, may be connected or coupled to processor 110. Information storage device 150 may include any type of persistent or non-volatile memory or storage, such as a flash memory and/or a solid state, magnetic, or optical disk drive.

Processor 110 may represent one or more processors or processor cores integrated on a single substrate or packaged within a single package, each of which may include multiple threads and/or multiple execution cores, in any combination. Each processor represented as or in processor 110 may be any type of processor, including a general purpose microprocessor, such as a processor in the Intel® Core® Processor Family or other processor family from Intel® Corporation or another company, a special purpose processor or microcontroller, or any other device or component in an information processing system in which an embodiment of the present invention may be implemented. Processor 110 may be architected and designed to operate according to any instruction set architecture, with or without being controlled by microcode.

Processor 110 may include an array 112 of PUF cells having integrated loads according to an embodiment of the present invention, where some cells have been stabilized and others have been destabilized according to an embodiment of the present invention. Although embodiments of the present invention are described as within array 112 in processor 110 in information processing system 100, the present invention may be embodied in any PUF cell in any device.

Figure 2:
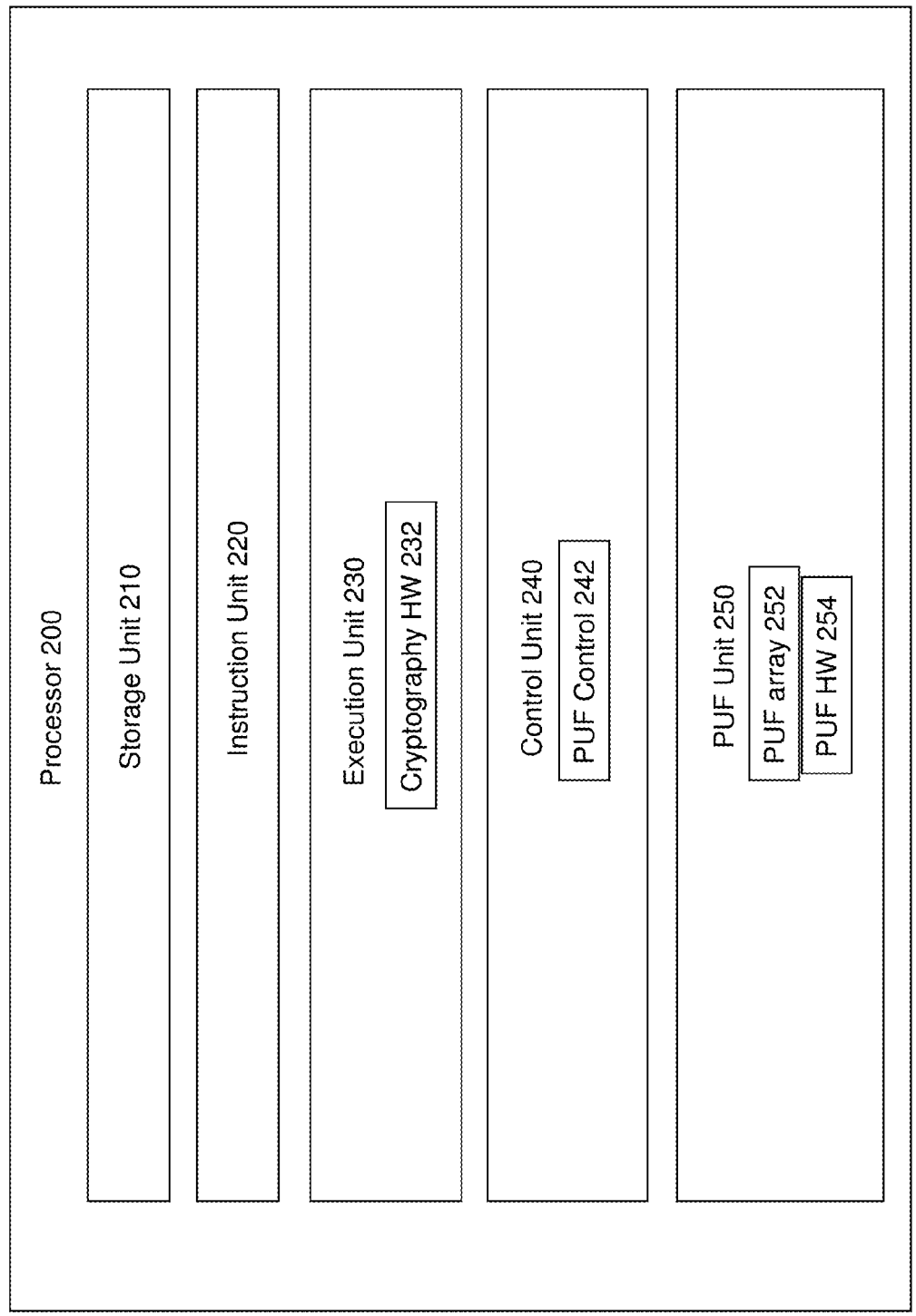
FIG. 2 illustrates a processor including a physically unclonable function array according to an embodiment of the present invention.

FIG. 2 illustrates processor 200, which may represent an embodiment of processor 110 in FIG. 1 or an execution core of a multicore processor embodiment of processor 110 in FIG. 1. Processor 200 may include storage unit 210, instruction unit 220, execution unit 230, control unit 240, and PUF unit 250. Each such unit is shown as a single unit for convenience; however, the circuitry of each such unit may be combined within and/or distributed throughout processor 200 according to any approach. Processor 200 may also include any other circuitry, structures, or logic not shown in FIG. 1. PUF unit 250 may be physically separate from or contained within any other unit of processor 200.

PUF unit 250 may include PUF array 252 corresponding to array 112 in FIG. 1, where PUF array 250 may include any one or more rows, any one or more columns, and/or any one or more separate arrays of PUF cells, each such row, column, and/or array including any number of cells arranged in any manner. Therefore, PUF array 252 may be of any size, which may be chosen according to a desired size (e.g., number of bits) of a PUF key and an expected dark bit frequency and/or error rate. PUF unit 250 may also include PUF hardware 254 to challenge and/or evaluate PUF cells, post-process the results, and generate one or more PUF keys, or such circuitry may be physically located outside of PUF unit 250. The PUF cells in PUF array 252 and additional details of PUF unit 250 are further described below.

Storage unit 210 may include any combination of any type of storage usable for any purpose within processor 200; for example, it may include any number of readable, writable, and/or read-writable registers, buffers, and/or caches, implemented using any memory or storage technology, in which to store capability information, configuration information, control information, status information, performance information, instructions, data, and any other information usable in the operation of processor 200, as well as circuitry usable to access such storage and/or to cause or support various operations and/or configurations associated with access to such storage.

Instruction unit 220 may include any circuitry, logic, structures, and/or other hardware, such as an instruction decoder, to fetch, receive, decode, interpret, schedule, and/or handle instructions to be executed by processor 200. Any instruction format may be used within the scope of the present invention; for example, an instruction may include an opcode and one or more operands, where the opcode may be decoded into one or more micro-instructions or micro-operations for execution by execution unit 230. Operands or other parameters may be associated with an instruction implicitly, directly, indirectly, or according to any other approach.

Execution unit 230 may include any circuitry, logic, structures, and/or other hardware, such as arithmetic units, logic units, floating point units, shifters, etc., to process data and execute instructions, micro-instructions, and/or micro-operations. Execution unit 230 may represent any one or more physically or logically distinct execution units.

Execution unit 230 may also include cryptographic hardware 232 to implement any one or more cryptographic algorithms. Cryptographic hardware 232 may be hardwired or otherwise connected PUF unit 250 such that one or more PUF keys generated by PUF unit 250 or other keys derived from such PUF keys may be used as cryptographic keys by cryptographic hardware 232, without exposing any such PUF key, derived key, cryptographic key, or any output of PUF unit 250 to software (e.g., read access) or any other means of discovery.

Control unit 240 may include any microcode, firmware, circuitry, logic, structures, and/or hardware to control the operation of the units and other elements of processor 200 and the transfer of data within, into, and out of processor 200. Control unit 240 may cause processor 200 to perform or participate in the performance of method embodiments of the present invention, such as the method embodiments described below, for example, by causing processor 200, using execution unit 230 and/or any other resources, to execute instructions received by instruction unit 220 and micro-instructions or micro-operations derived from instructions received by instruction unit 220. The execution of instructions by execution 230 may vary based on control and/or configuration information in storage unit 210.

In an embodiment, control unit 240 may include PUF soft dark bit masking control hardware/logic 242 to control soft dark bit testing and masking according to embodiments of the present invention, or such control hardware/logic may be located elsewhere, such as within PUF unit 250.

Figure 3:
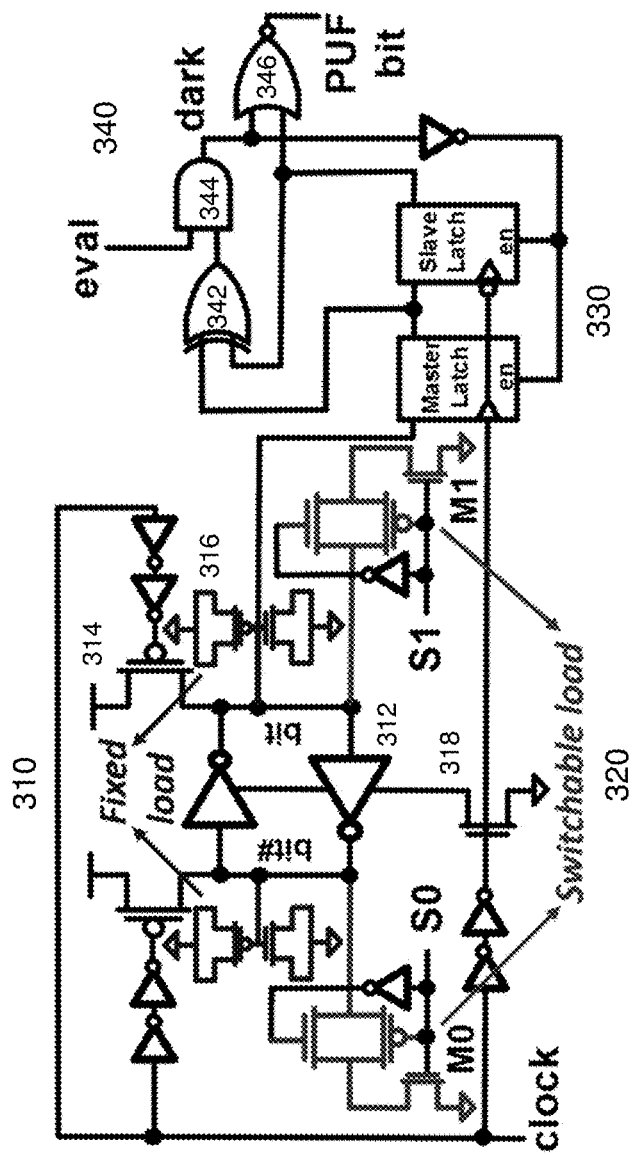
FIG. 3 illustrates a physically unclonable function cell according to an embodiment of the present invention.

PUF array 252 includes PUF cells having integrated loads for soft dark bit masking according to an embodiment of the present invention. FIG. 3 illustrates one such PUF cell 300 according to an embodiment of the present invention. PUF cell 300 includes basic PUF cell 310, integrated switchable loads 320, output stage 330, and dark bit mask circuit 340.

Basic PUF cell 310 includes a cross-coupled inverter pair 312 that is pushed into an unstable state, in which both 'bit' and 'bit#' signals are high, by pre-charge transistors 314 during a first clock phase (e.g., 'clock' is low). During a second clock phase (e.g., 'clock' is high), process variation related factors such as mismatches between fixed loads 316 cause one of 'bit' and 'bit#' to be pulled low by pull-down transistor 318, while the other of 'bit' and 'bit#' remains high. However, such factors (which may be collectively referred to as intrinsic mismatch) may be insufficient to cause a basic PUF cell to resolve to the same value of 'bit' every time it is evaluated within the range of voltage, temperature, and other conditions in which it is expected to operate. These PUF cells that do not resolve consistently to the same value may be referred to as dark bits.

Therefore, integrated switchable loads 320 are provided to identify PUF cells that are likely to be dark bits. In particular, integrated switchable loads 320 may be used to identify dark bits in two clock cycles, without varying the operating voltage or temperature. During normal operation, both of control signals 'S$_0$' and 'S$_1$' may be held high (e.g., by operation of control hardware/logic 242), isolating loads M$_0$ and M$_1$ from basic PUF cell 310. However, during dark bit testing operation, control signals 'S$_0$' and 'S$_1$' may alternately be pulled low (e.g., by operation of control hardware/logic 242) to alternately connect loads M$_0$ and M$_1$ to basic PUF cell 310.

Figure 4:
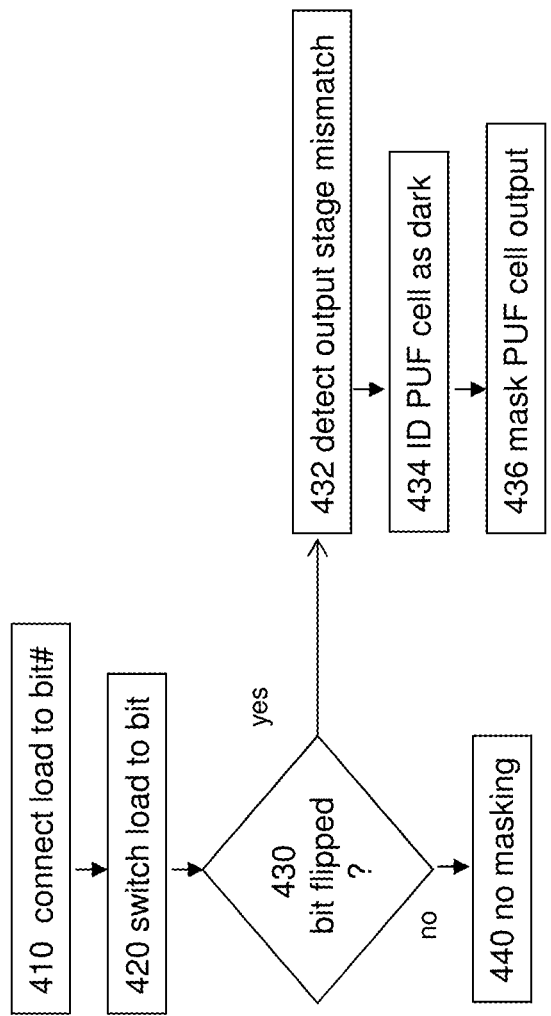
FIG. 4 illustrates a method for soft dark bit masking according to an embodiment of the present invention.

More specifically, FIG. 4 illustrates method 400 for identifying PUF dark bits and soft dark bit masking according to an embodiment of the present invention. Although method embodiments of the invention are not limited in this respect, reference may be made to elements of FIGS. 1, 2, and 3 to help describe the method embodiment of FIG. 4. Various portions of method 400 may be performed by hardware, firmware, software, and/or a user of a system or device.

In box 410 of method 400, during a first clock cycle of testing, control signal S$_0$ may be pulled low, while control signal S$_1$ remains high, to connect load M$_0$ to the 'bit#' signal line while load M$_1$ is disconnected. During this first clock cycle, the value of the 'bit' signal is captured by the master latch of output stage 330.

In box 420, during a second clock cycle of testing, control signal 'S$_1$' may be pulled low, while control signal 'S$_0$' is returned to high, to connect load M$_1$ to the bit signal line while load M$_0$ is disconnected. During this second clock cycle, the first clock cycle's value of the bit signal is passed from the master latch to the slave latch of output stage 330, while the second clock cycle's value of the bit signal is captured by the master latch.

Thus, integrated switchable loads 320 may be used to test basic PUF cell 310 under two roughly opposite conditions. Together, the two conditions add an extrinsic mismatch to the intrinsic mismatch of basic PUF cell 310. If the value of the bit signal is the same under both conditions, then the extrinsic mismatch could not overcome the intrinsic mismatch, so the intrinsic mismatch may be expected to be great enough to cause the bit signal to resolve to the same value each time the PUF cell is evaluated under normal operating conditions (i.e., the PUF cell is stable). In that case, the PUF cell should not be identified as a dark bit. However, if the value of the bit signal differs between the two opposing conditions, then the extrinsic mismatch overcame the intrinsic mismatch, so the intrinsic mismatch may not be great enough to cause the bit signal to resolve to the same value each time the PUF cell is evaluated under normal operating conditions (i.e., the PUF cell is unstable). In that case, the PUF cell should be identified as a dark bit. The desired characteristics (e.g., capacitive load based on IC device geometries) of integrated switchable loads 320 may be chosen prior to IC fabrication such that the two opposite test conditions may be expected to be sufficient to accurately identify any PUF cell that is likely to be unstable.

Box 430 represents the determination of whether to identify a PUF cell as a dark bit. If the value of the bit signal changes from the first clock cycle of testing to the second clock cycle of testing, then the output of the slave latch will differ from the output of the master latch, which will be detected in box 432 by exclusive OR (XOR) gate 342 of dark bit mask circuit 340.

In box 434, the output of AND gate 344 identifies the PUF cell as a dark bit (e.g., the dark bit signal goes high), which blocks the clock to output state 330 to keep the dark bit signal high for the remainder of the evaluation period (e.g., the time during which the 'eval' signal is high).

In box 436, NOR gate 346 forces the 'PUFbit' signal low, thereby masking the output of basic PUF cell 310.

Note that boxes 430, 432, 434, and 436 represent the operation of combinational logic, not different clock cycles or phases. Therefore, the identification of dark bits may be performed in two clock cycles (e.g., as represented by boxes 410 and 420), rather than the hundred or more clock cycles that may be used in other approaches to soft dark bit masking.

Returning to box 430, if the value of the bit signal does not change from the first clock cycle of testing to the second clock cycle of testing, then, in box 440, the output of the slave latch will match the output of the master latch and dark bit mask circuit 340 will not mask the output of basic PUF cell 310.

Figure 5:
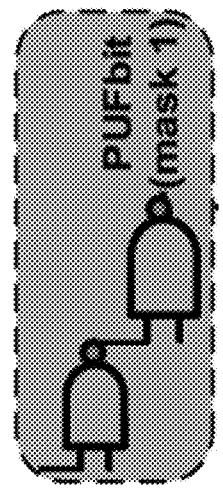
FIG. 5 illustrates a dark bit mask circuit according to an embodiment of the present invention.

Note that dark bit mask circuit 340 of FIG. 3 is designed to mask the basic PUF cell output by forcing the 'PUFbit' signal low. FIG. 5 shows dark bit mask circuit 500 to mask the basic PUF cell output by forcing the 'PUFbit' signal high. A balance of each type of mask circuit may be used in the design of a PUF array in order to minimize the impact of dark bit masking on overall key entropy.

An embodiment of the present invention also or instead provides for stabilizing and/or destabilizing basic PUF cells.

Figure 6:
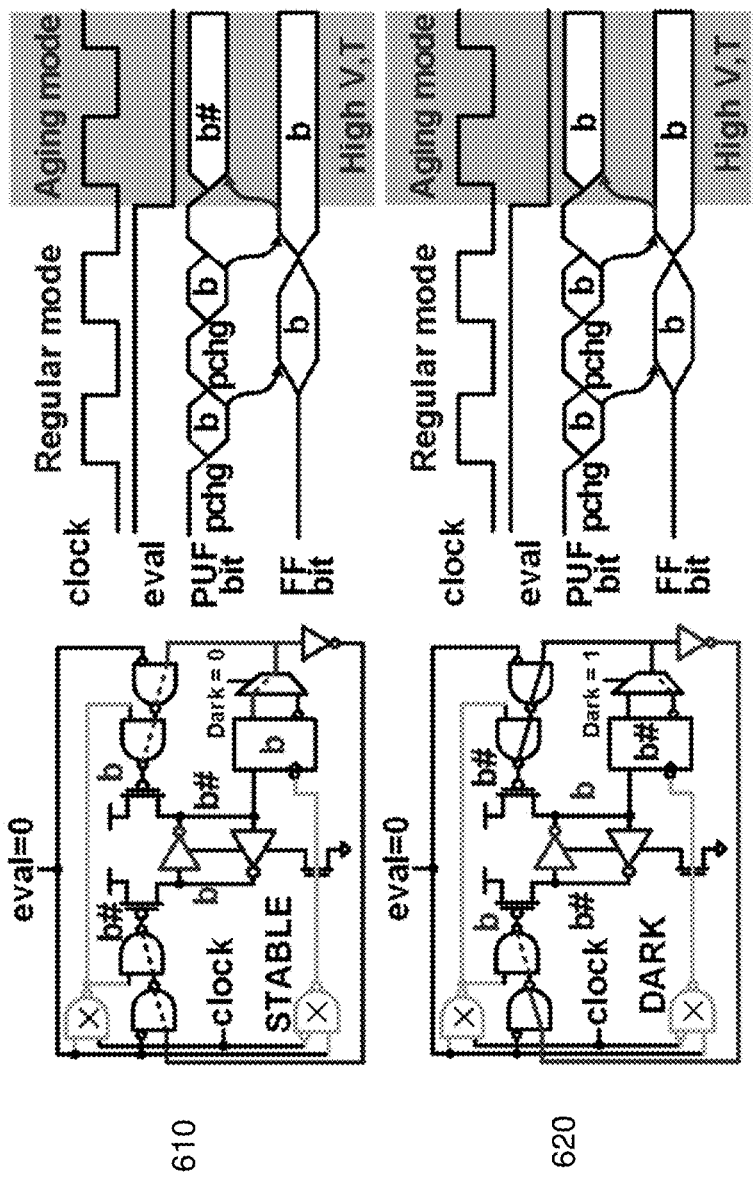
FIG. 6 illustrates a circuit for stabilizing stable PUF cells and destabilizing unstable PUF cells according to an embodiment of the present invention.

An embodiment of the present invention in selective stabilization/destabilization circuit 600 is shown in FIG. 6, where illustration 610 represents operation of the circuit when the PUF cell is stable and illustration 620 represents operation of the circuit when the PUF cell is unstable.

Burn-in induced aging may be used to stabilize PUF cells by writing back the complement of the basic PUF cell output to the cross-coupled nodes, as shown in illustration 610. However, this approach also reduces the instability of dark PUF cells, thereby making them more difficult to flag during dark-bit evaluation, leading to mask mismatch and increased bit-error. To mitigate this problem, embodiments of the present invention may use selective destabilization, wherein, for cells that get flagged as dark, the same (rather than the complementary) basic PUF cell output is written-back to the internal nodes, as shown in illustration 620.

Figure 7:
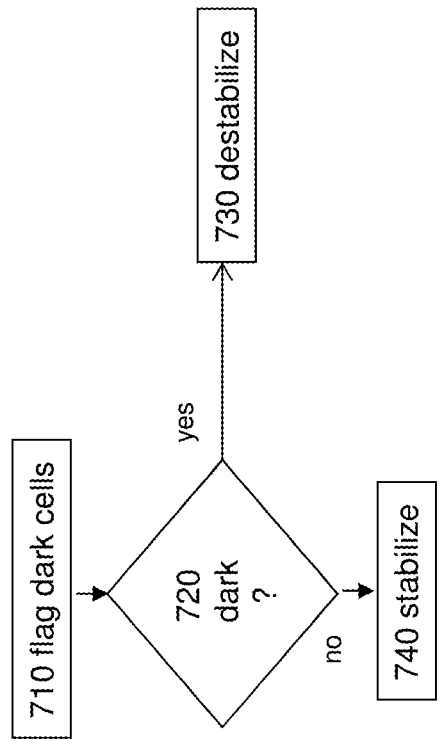
FIG. 7 illustrates a method for stabilizing stable PUF cells and destabilizing unstable PUF cells according to an embodiment of the present invention.

FIG. 7 shows method 700 for stabilizing/destabilizing PUF cells according to an embodiment of the present invention. In box 710 of method 700, unstable cells are flagged as dark using load modulation according to an embodiment of the present invention.

Box 720 represents a decision made based on whether the PUF cell has been flagged as dark. If the PUF cell has been flagged as dark, then, in box 730, the multiplexer at the basic PUF cell output flip-flop is configured to write-back the output value to the PUF cell, as shown in illustration 620, in order to destabilize the PUF cell so that it is likely to continue to be flagged as dark in subsequent evaluations. However, if the PUF cell has not been flagged as dark, then, in box 740, the multiplexer at the basic PUF cell output flip-flop is configured to write-back the complement of the output value to the PUF cell, as shown in illustration 610, in order to stabilize the PUF cell so that it is likely to remain stable in subsequent evaluations.

In various embodiments of the present invention, an operation for stabilizing/destabilizing PUF cells (e.g., method 700) may be performed at one or more different times. In an embodiment, the operation may be performed prior to field use of an IC, such as by a manufacturer or vendor of the IC during reliability testing and burn-in. At this time, the operating voltage and/or temperature may be varied to induce and/or accelerate aging in the desired direction.

In an embodiment, the operation may also or instead be performed during field use of the IC, such as under the control of logic embedded in the IC following every evaluation of the PUF cells, in order to drive long-term aging in the desired direction.

Since burn-in induced aging depends on temperature, voltage, duration, and other parameters that may be different for different products, the post burn-in effects of the use of stabilization/destabilization according to embodiments of the present invention may range from mild to extensive changes in PUF behavior for different systems. More intensive burn-in favors stable PUF cells by reinforcing their already existing internal bias. In contrast, burn-in reduces existing internal bias in dark bits by introducing bias toward the opposite value. Hence, occasionally an intensive burn-in process may transform an unstable PUF cell tending towards one value into a stable PUF having the opposite value, thereby causing mask mismatch and increased bit-error.

Therefore, embodiments of the present invention may include an adaptive technique that dynamically directs aging in the desired direction. In this embodiment, a counter keeps track of burn-in duration and periodically re-initiates the write-back mechanism by evoking dark-bit evaluation. This technique ensures that dark PUF cells that flip internal bias polarity subsequently receive the appropriate complementary bias to tune them towards overall higher instability. This approach is also applicable for long term in-field aging, wherein directed aging is appropriately tuned towards improving PUF accuracy, thereby making the IC agnostic to post fabrication parameters that influence aging.

Although FIGS. 3, 4, 5, 6, and 7 show one particular configuration of a basic PUF cell, one configuration for and approach to integrating and switching loads, two configurations for soft masking of dark bits, and one configuration for and approach to selective stabilization/destabilization, embodiments of the present invention are not limited to the configurations, approaches, and/or other details shown. Embodiments based on other configurations and approaches are possible within the scope of the present invention.

In various embodiments of the present invention, the methods illustrated in FIGS. 4 and 7 may be performed in a different order, with illustrated boxes combined or omitted, with additional boxes added, or with a combination of reordered, combined, omitted, or additional boxes. Furthermore, method embodiments of the present invention are not limited to methods 400 or 700, or variations thereof. Many other method embodiments (as well as apparatus, system, and other embodiments) not described herein are possible within the scope of the present invention.

Embodiments or portions of embodiments of the present invention, as described above, may be stored on any form of a machine-readable medium. For example, all or part of methods 400 or 700 may be embodied in software or firmware instructions that are stored on a medium readable by processor 110, which when executed by processor 110, cause processor 110 to execute an embodiment of the present invention. Also, aspects of the present invention may be embodied in data stored on a machine-readable medium, where the data represents a design or other information usable to fabricate all or part of processor 110.

Thus, embodiments of an invention for PUF soft dark bit masking have been described. While certain embodiments have been described, and shown in the accompanying drawings, it is to be understood that such embodiments are merely illustrative and not restrictive of the broad invention, and that this invention not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. An apparatus comprising:
   a basic physically unclonable function (PUF) cell;
   a load, the load selectively connectable to the basic PUF cell to determine whether the basic PUF cell is unstable; and
   a masking circuit to mask the output of the basic PUF cell if the basic PUF cell is determined to be unstable.

2. The apparatus of claim 1, further comprising a feedback path to destabilize the basic PUF cell if the basic PUF cell is determined to be unstable.

3. The apparatus of claim 2, wherein the feedback path is also to stabilize the basic PUF cell if the basic PUF cell is determined to be stable.

4. The apparatus of claim 3, further comprising a multiplexer to select between destabilizing and stabilizing the basic PUF cell.

5. The apparatus of claim 1, wherein the load includes a first load selectively connectable to a first node of the basic PUF cell, the first node to indicate an output of the basic PUF cell.

6. The apparatus of claim 5, wherein the load also includes a second load selectively connectable to a second node of the basic PUF cell, the second node logically complementary to the first node.

7. The apparatus of claim 6, wherein the first and second loads are controlled by logically complementary control signals.

8. The apparatus of claim 7, wherein selective connectability of the first and second loads is to create an extrinsic mismatch in the basic PUF cell.

9. The apparatus of claim 8, wherein the basic PUF cell also includes an intrinsic mismatch.

10. The apparatus of claim 9, wherein the basic PUF cell is to be determined to be unstable if the extrinsic mismatch is greater than the intrinsic mismatch.

11. The apparatus of claim 6, further comprising an output stage to detect whether the output of the basic PUF cell changes in response to switching between connecting the first load and the second load.

12. The apparatus of claim 1, wherein the masking circuit is to mask the output of the basic PUF cell to a first logical value.

13. The apparatus of claim 12, wherein the masking circuit is to mask the output of the basic PUF cell to a second logical value complementary to the first logical value.

14. A method comprising:
connecting a switchable load to a basic physically unclonable function (PUF) cell;
operating the basic PUF cell with the switchable load connected;
determining, based on operation with the switchable load connected, whether the basic PUF cell is unstable;
masking, if the basic PUF cell is determined to be unstable, an output of the basic PUF cell.

15. The method of claim 14, further comprising destabilizing the basic PUF cell if the basic PUF cell is determined to be unstable.

16. The method of claim 15, further comprising stabilizing the basic PUF cell is the basic PUF cell is determined to be stable.

17. The method of claim 14, wherein connecting the switchable load includes connecting a first load to a first node of the basic PUF cell, the first node to indicate an output of the basic PUF cell.

18. The method of claim 17, wherein connecting the switchable load also includes connecting a second load to a second node of the basic PUF cell, the second node logically complementary to the first node.

19. The method of claim 18, wherein determining includes determining that the basic PUF cell is unstable if the output of the basic PUF cell changes in response to switching between connecting the first load and the second load.

20. An apparatus comprising:
an array of physically unclonable function (PUF) cells, each PUF cell including:
a basic physically unclonable function (PUF) cell;
a load, the load selectively connectable to the basic PUF cell to determine whether the basic PUF cell is unstable; and
a masking circuit to mask the output of the basic PUF cell if the basic PUF cell is determined to be unstable; and
key generation logic to generate a key based on the array of PUF cells.

* * * * *